(12) United States Patent
Tan

(10) Patent No.: US 6,780,040 B2
(45) Date of Patent: Aug. 24, 2004

(54) ELECTRICAL CONNECTOR WITH STANDOFFS

(75) Inventor: Shijie Tan, Kunsan (CN)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 10/447,083

(22) Filed: May 27, 2003

(65) Prior Publication Data

US 2004/0087200 A1 May 6, 2004

(30) Foreign Application Priority Data

Nov. 5, 2002 (TW) ...................................... 91217739 U

(51) Int. Cl.$^7$ ............................................ H01R 13/620
(52) U.S. Cl. ......................................................... 439/342
(58) Field of Search .................................. 439/342, 259, 439/261–265, 267, 268

(56) References Cited

U.S. PATENT DOCUMENTS 5,722,848 A * 3/1998 Lai et al. ................... 439/342
6,210,197 B1 * 4/2001 Yu ............................. 439/342
6,338,640 B1    1/2002 Lin
6,340,309 B1    1/2002 Lin et al.
6,419,514 B1    7/2002 Yu
6,485,321 B1 * 11/2002 Trout et al. ................. 439/342

* cited by examiner

*Primary Examiner*—Hien Vu
(74) *Attorney, Agent, or Firm*—Wei Te Chung

(57) ABSTRACT

An electrical connector (1) comprises an insulative base (10), a cover (12) mounted on the base, a plurality of terminals (11), and an actuator (14) actuating the cover to slide over the base. The base defines a plurality of passageways (101) receiving the corresponding terminals therein. The cover comprises a main body (121) defines a plurality of passages (1210) corresponding to the passageways of the base. Four L-shaped standoffs (1212) perpendicularly extend from corresponding four corners of the main body. Each standoff has a same height. A cross sectional area of each of the standoffs is far less than a cross sectional area of the main body. When a CPU (2) is mounted on the electrical connector, it is supported by the standoffs of the cover. This insures stably and securely retention of the CPU on the cover of the connector.

2 Claims, 4 Drawing Sheets

ELECTRICAL CONNECTOR WITH STANDOFFS

BACKGROUND OF THE INVENTION

1. Field of the Invention

The present invention relates to an electrical connector for electrically connecting a central processing unit (CPU) with a printed circuit board (PCB), and particularly to an electrical connector with a cover having a plurality of standoffs.

2. Description of Prior Art

CPU socket connectors are widely used in personal computer (PC) systems to electrically connect CPUs with PCBs. A CPU socket connector usually comprises a base, and a cover slidably engaged on the base. The base defines a plurality of passageways receiving a plurality of conductive contacts. The cover defines a plurality of passages for insertion of contact pins of the CPU thereinto. Thus, pins of the CPU are electrically mated with the corresponding contacts secured in the base. This kind of electrical connector is disclosed in U.S. Pat. Nos. 6,419,514, 6,340,309 and 6,338,640.

Referring to FIG. 3, U.S. Pat. No. 6,419,514 discloses a conventional CPU socket connector 3. The CPU socket connector 3 comprises a base 30 soldered on a PCB (not shown), a cover 32 mounted on the base 30, an actuator 34 actuating the cover 32 to slide along the base 30, and a plurality of contacts 36. A plurality of passageways 302 is defined in the base 30 arranged in a rectangular array, the passageways 302 receiving the contacts 36 therein. The cover 32 is generally a thin plate, and comprises a supporting portion 320. A plurality of passages 3201 is defined in the supporting portion 320 of the cover 32, corresponding to the passageways 302 of the base 30, for insertion of pins of the CPU 4 thereinto.

Referring to FIG. 4, in assembly, the CPU 4 is attached on the supporting portion 320 of the cover 32. The pins of the CPU 4 are inserted through the passages 320 of the cover 32 into the passageways 302 of the base 30, and then electrically mate with the contacts 36 of the base 30. The base 30 of the connector 3 is soldered to the PCB. Thus, the contacts 36 of the base 30 electrically connect the CPU 4 with the PCB.

In use, the CPU 4 typically generates much heat. Because the cover 32 is generally a thin plane, the cover 32 is liable to easily warp when subjected to heat generated from the CPU 4. When this happens, the CPU 4 may be only slantingly attached on the cover 32. The pins of the CPU 4 may become disconnected from the contacts 36. This results in interruption or failure of electrical connection between the CPU 4 and the PCB.

A new CPU socket connector that overcomes the above-mentioned problems is desired.

SUMMARY OF THE INVENTION

An object of the present invention is to provide an electrical connector having standoffs that can safely support a CPU thereon.

In order to achieve the above object, an electrical connector in accordance with a preferred embodiment of the present invention comprises an insulative base, a cover mounted on the base, a plurality of conductive terminals, and an actuator actuating the cover to slide along the base. The base defines a plurality of passageways receiving the corresponding terminals therein. The cover comprises a main body and a protrusion. The main body defines a plurality of passages corresponding to the passageways of the base. Four L-shaped standoffs extend perpendicularly upwardly from four corners of the main body respectively. Each standoff has a same height. A cross sectional area of each of the standoffs is far less than a cross sectional area of the main body. When a CPU is mounted on the electrical connector, it is supported by the standoffs of the cover.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
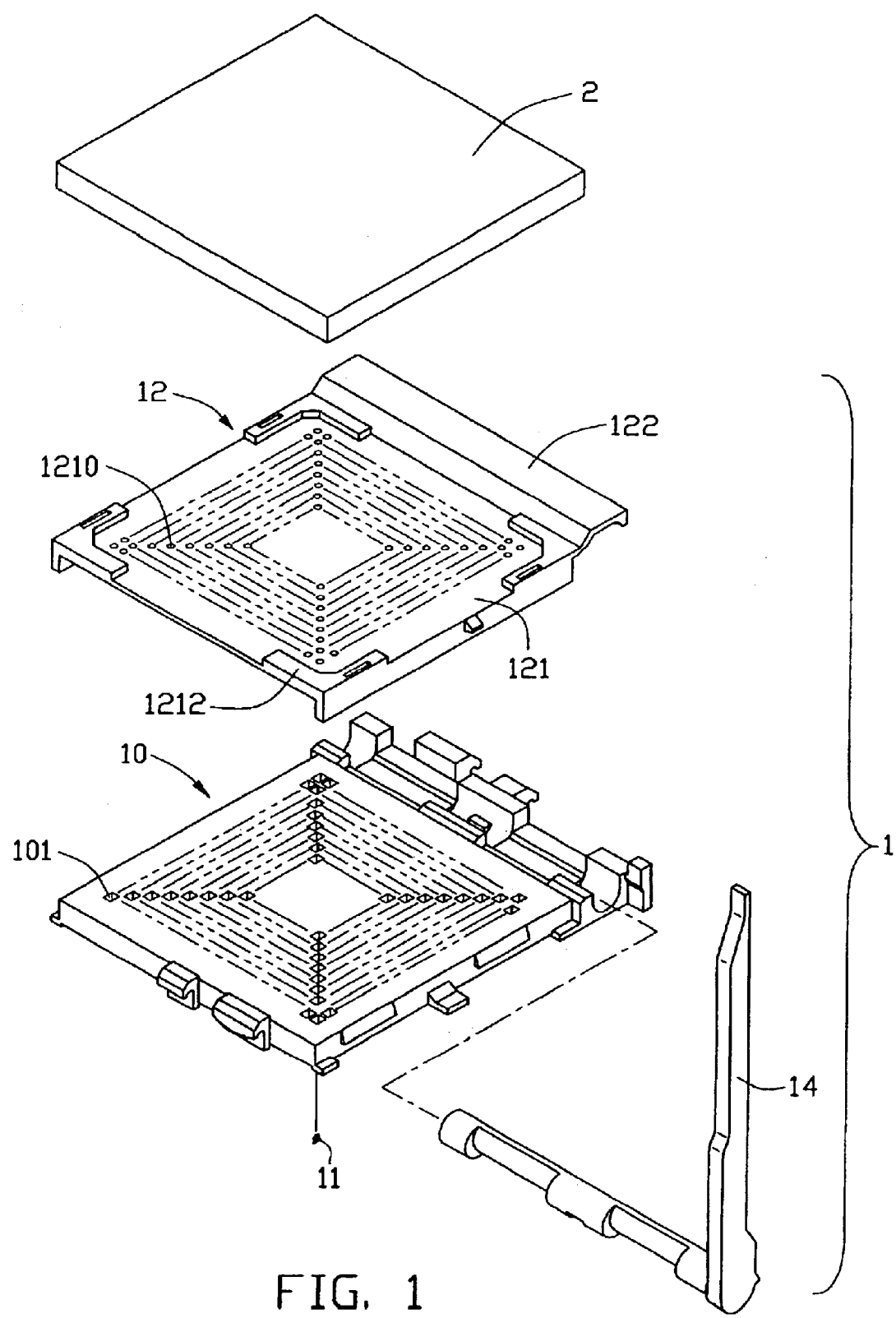
FIG. 1 is a simplified, exploded isometric view of an electrical connector in accordance with the preferred embodiment of the present invention, together with a CPU.

Referring to FIG. 1, an electrical connector I in accordance with the preferred embodiment of the present invention electrically connects a central processing unit (CPU) 2 with a printed circuit board (PCB) (not shown). The connector 1 comprises an insulative base 10 attached to the PCB, a cover 12 mounted on the base 10, an actuator 14 actuating the cover 12 to slide along the base 10, and a plurality of terminals 11.

The base 10 defines a plurality of passageways 101 arranged in a rectangular array, the passsageways 101 receiving the corresponding terminals 11. The cover 12 comprises a rectangular main body 121, and a raised protrusion 122 in communication with one end of the main body 121. The main body 121 defines a plurality of passages 1210 corresponding to the Four L-shaped spaced standoffs 1212 extend perpendicularly upwardly from four corners of the main body 121 respectively. Each standoff 1212 has a same height. A cross sectional area of each standoff 1212 is far less than a cross sectional area of the main body 121. Therefore, if the cover 12 warps due to application of heat or external force, the standoffs 1212 resist warping.

Figure 2:
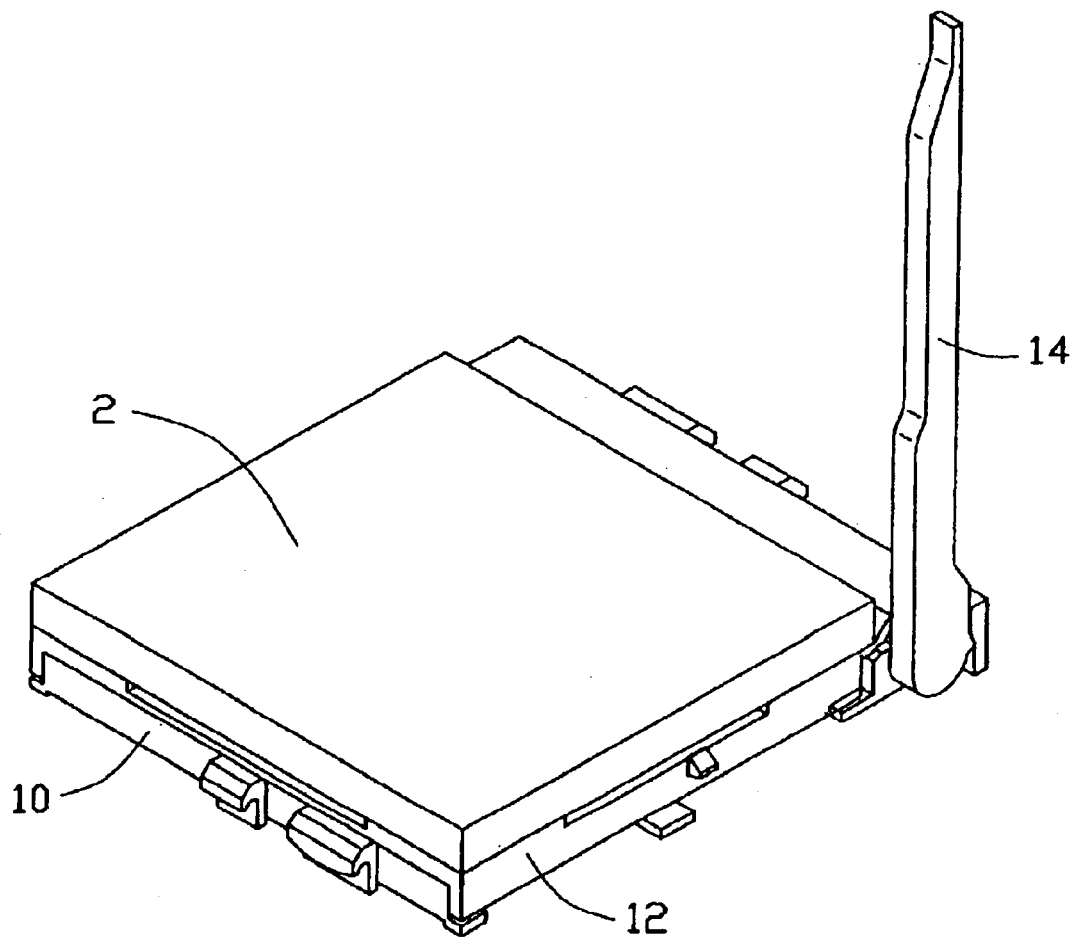
FIG. 2 is an assembled view of FIG. 1, showing the CPU mounted on a cover of the electrical connector.
Figure 3:
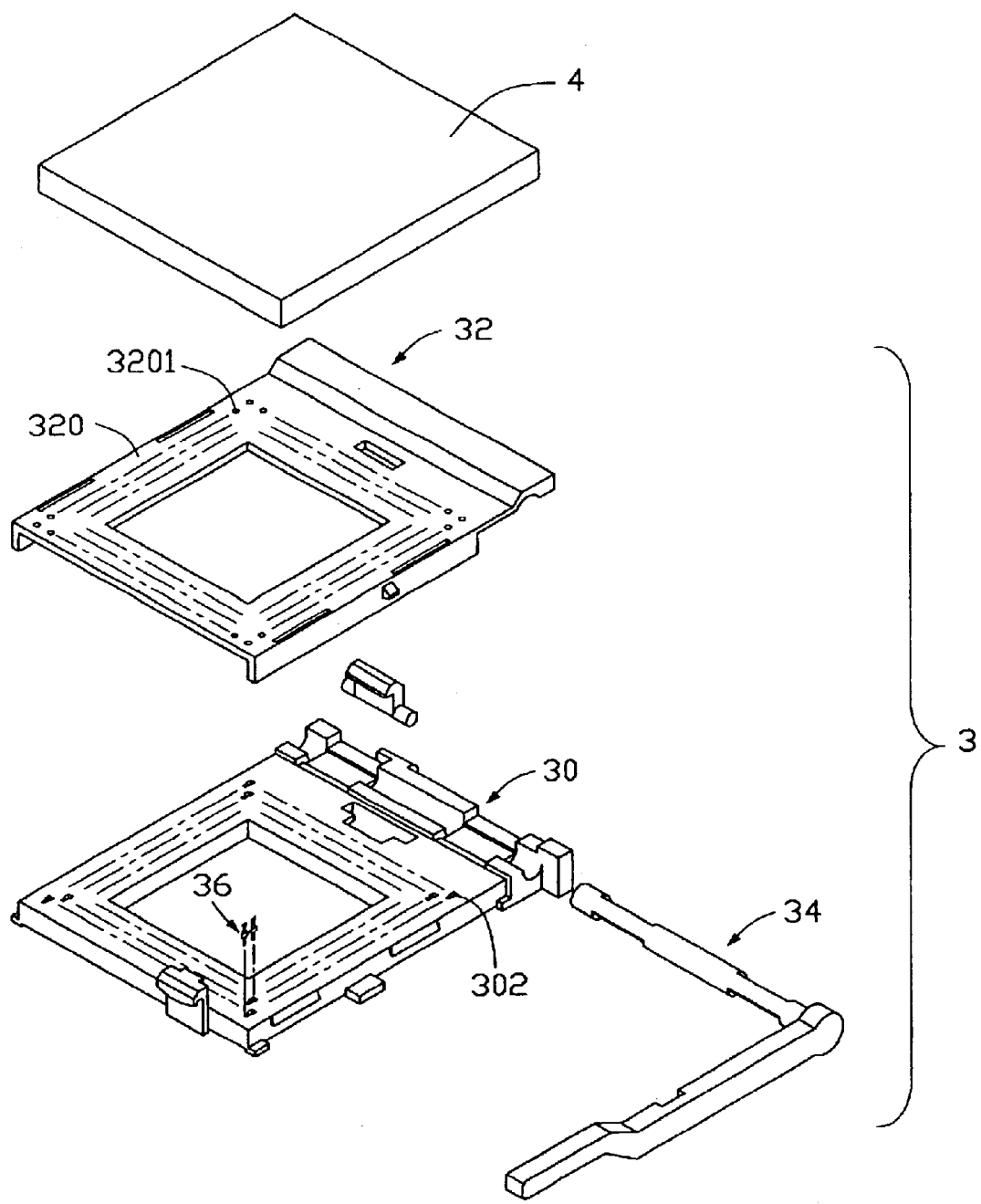
FIG. 3 is a simplified, exploded isometric view of a conventional CPU socket connector, together with a CPU.
Figure 4:
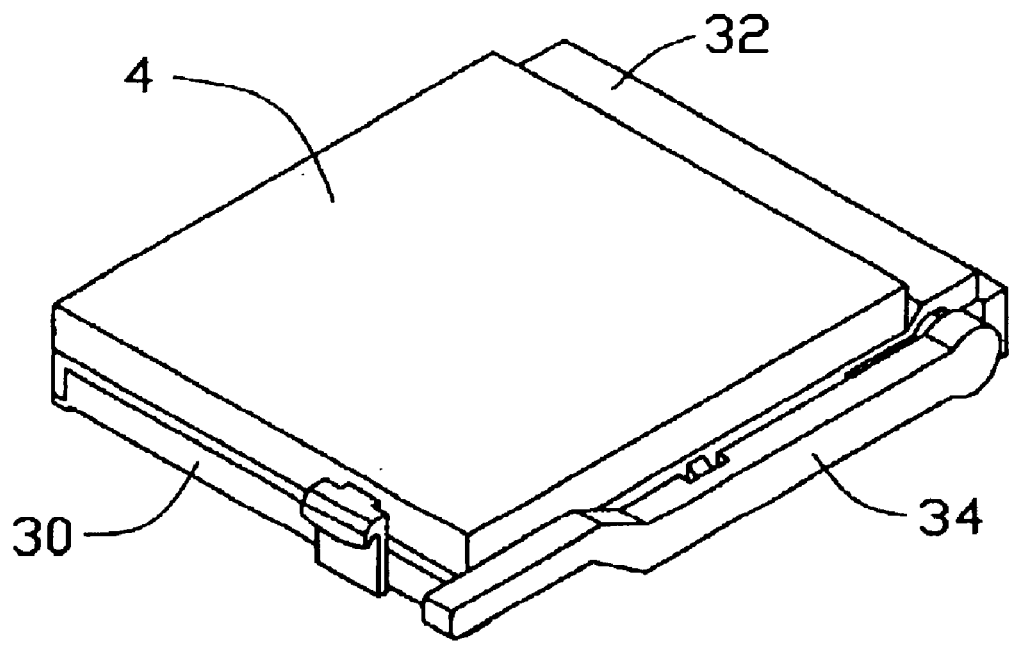
FIG. 4 is an assembled view of FIG. 3, showing the CPU is attached on a cover of the CPU socket connector.

Referring to FIG. 2, in use, the CPU 2 is attached on the standoff 1212 of the cover 12. The main body 121 of the cover 12 does not support the CPU 2. The pins of the CPU 2 are inserted through the passages 1210 of the cover 12 into the passageways 101 of the base 10, for electrically contacting the terminals 11 of the base 10. The base 10 of the connector 1 is soldered to the PCB. Thus, the terminals 11 of the base 10 can electrically connect the CPU 2 with the PCB.

Because the standoffs 1212 of the cover 12 resist warping, the CPU 2 can remain stably and securely mounted on the cover 12 of the connector 1. Accordingly, the pins of the CPU 2 can firmly contact the terminals 11 of the base 10 of the connector 1. This insures reliable electrical connection of the CPU 2 and the PCB.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting a central processing unit (CPU) with a circuit board, the electrical connector comprising:

an insulative base defining a plurality of passageways;

a plurality of terminals accommodated in the passageway of the base;

a cover mounted on the base, the cover comprising a main body having four corners and a raised protrusion extending from one end of the main body, the main body defining a plurality of passages corresponding to the passageways of the base, a plurality of spaced standoffs extending from edges of the corners of the main body for supporting the CPU; and an L-shaped actuator for actuating the cover to slide over the base;

whereby the CPU can stably and securely be mounted on the cover of the connector;

wherein each of the standoffs is L-shaped and extends perpendicularly upwardly from each of the four corner of the main body; and wherin each of the standoffs has a same height.

2. The electrical connector as described in claim 1, wherein a cross sectional area of each of the standoffs is far less than a cross sectional area of the main body.

* * * * *